United States Patent
Uchida (10) Patent No.: US 7,595,587 B2
(45) Date of Patent: Sep. 29, 2009

(54) ORGANIC ELECTROLUMINESCENT ELEMENT EXHIBITING TEMPERATURE-DEPENDENT PHOTOLUMINESCENCE INTENSITY

(75) Inventor: Hideki Uchida, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 31 days.

(21) Appl. No.: 11/570,714

(22) PCT Filed: May 16, 2005

(86) PCT No.: PCT/JP2005/008897

§ 371 (c)(1),
(2), (4) Date: Jul. 26, 2007

(87) PCT Pub. No.: WO2005/122702

PCT Pub. Date: Dec. 29, 2005

(65) Prior Publication Data

US 2007/0298279 A1    Dec. 27, 2007

(30) Foreign Application Priority Data

Jun. 16, 2004    (JP) .............................. 2004-178600

(51) Int. Cl.
*H01L 51/50*    (2006.01)
*H01L 51/52*    (2006.01)

(52) U.S. Cl. .................. 313/504; 313/503; 428/690

(58) Field of Classification Search ......... 313/500–512; 428/690, 917

See application file for complete search history.

(56) References Cited

U.S. PATENT DOCUMENTS 6,326,091 B1    12/2001    Schoo et al.
6,355,773 B1    3/2002    Weinfurtner et al.
2003/0186080 A1    10/2003    Kamatani et al.

FOREIGN PATENT DOCUMENTS

| JP | 11-508731 A | 7/1999 |
|---|---|---|
| JP | 2001-151868 A | 6/2001 |
| JP | 2001-284061 A | 10/2001 |
| JP | 2002-138132 A | 5/2002 |
| JP | 2002-317033 A | 10/2002 |
| JP | 2003-73479 A | 3/2003 |

(Continued)

OTHER PUBLICATIONS

Holmes et al. "Blue organic electrophosphorescence using exothermic host-guest energy transfer", Appl. Phys. Letters, vol. 82, No. 15, pp. 2422-2424, Apr. 14, 2003.*

(Continued)

*Primary Examiner*—Mariceli Santiago
(74) *Attorney, Agent, or Firm*—Keating & Bennett, LLP (57) ABSTRACT

To provide an organic electroluminescent element excellent in lifetime characteristics, an organic electroluminescent element-testing device and an organic electroluminescent element-testing method each capable of easily testing quality of lifetime characteristics of an organic electroluminescent element in a short time without deterioration of the element, and an organic electroluminescent display device. An organic electroluminescent element having a structure in which one or more organic layers including at least a luminescent layer are interposed between electrodes, wherein the organic electroluminescent element has a photoluminescence intensity at 300 K stronger than a photoluminescence intensity at a temperature of less than 300 K, and preferably stronger than a photoluminescence intensity at 5 K.

6 Claims, 5 Drawing Sheets

FOREIGN PATENT DOCUMENTS

| | | |
|---|---|---|
| JP | 2003-73480 A | 3/2003 |
| WO | 97/40648 A1 | 10/1997 |
| WO | 02/26856 A1 | 4/2002 |
| WO | 02/26859 A1 | 4/2002 |
| WO | 03/007395 A1 | 1/2003 |
| WO | 03/099901 A1 | 12/2003 |

OTHER PUBLICATIONS

Braun, D. et al. :"Visible Light Emission From Semiconducting Polymer Diodes," Applied Physics Letter 58(18); May 6, 1991; pp. 1982-1984.

Cao et al., "Ultrathin layer alkaline earth metals as stable electron-injecting electrodes for polymer light emitting diodes," Journal Of Applied Physics, Sep. 15, 2000, pp. 3618-3623, vol. 88, Santa Barbara, California.

Kenichi et al., "Unusual luminescence characteristics of(Ir ppy)3 at low temperature,"Japan Society of Applied Physics Spring Meeting 2003, p. 1412, 28p-A-4.

Kenichi et al., "Exciton migration and energy transfer length of Ir(ppy)3," Japan Society of Applied Physics Autumn Meeting 2003, p. 1206, 1a-YL-7.

International Search Report for PCT Application No. PCT/JP2005/008897; mailed Oct. 11, 2006.

* cited by examiner

Fig.10 under certain conditions to lifetime test, and then subjecting an element prepared under another conditions to lifetime test based on a feedback from the previous lifetime test. In this case, it takes a very long time to find the optimal conditions if the elements prepared under each condition are subjected to the lifetime test using the conventional lifetime testing method of organic EL elements. Accordingly, also in this respect, it is expected that information on the lifetime characteristics of the element is obtained without performing the aging test.

ORGANIC ELECTROLUMINESCENT ELEMENT EXHIBITING TEMPERATURE-DEPENDENT PHOTOLUMINESCENCE INTENSITY

BACKGROUND OF THE INVENTION

1. Field of the Invention

The present invention relates to an organic electroluminescent element, a testing device thereof and a testing method thereof, and an organic electroluminescent display device. More specifically, the present invention relates to an organic electroluminescent element used as an electroluminescent element in an organic electroluminescent display, a testing device and a testing method each suitable for testing lifetime characteristics of an organic electroluminescent element, and an organic electroluminescent display device.

2. Description of the Related Art

Demands for a Flat Panel Display (FPD) which is a slim profile and low in power consumption and lightweight have recently increased with high advancement in information technology. Particularly, attention has been focused on organic electroluminescence (hereinafter, also referred to as "EL") displays using organic luminescent materials because the displays can be driven at a low voltage and provide display with high brightness. Particularly, recent research and development remarkably improves luminescence efficiency of organic EL elements, and the organic EL displays including the organic EL elements have come into practical use.

Low-molecular organic EL materials and polymer organic EL materials may be mentioned as a luminescent material used in the organic EL elements. A general organic EL element using the polymer organic EL material has a structure, for example, in which, on a glass substrate, a transparent positive electrode made of indium tin oxide (hereinafter, also referred to as "ITO"), a positive hole transporting layer made of PEDOT/PSS (Poly(ethylene-dioxythiophene)/Poly(styrenesulfonate)), a luminescent layer made of a polymer organic EL material, a negative electrode made of Ca/Al, and the like are sequentially stacked. The organic EL element having such a structure is reported to attain a brightness of 10000 cd/m$^2$ or more, a luminescence efficiency of several lm/W to dozens lm/w, and a lifetime of thousands to tens of thousands hours.

Such a conventional organic EL element has sufficiently high brightness and luminescence efficiency, but the lifetime is not enough for practical application as a commercial product. The application range has been limited. Therefore, various measures have been conventionally investigated in order to improve the lifetime characteristics of the organic EL element. For example, techniques regarding improvement in the luminance material itself (for example, referring to Patent Document 1 (Japanese Kohyo Publication No. Hei-11-508731 (pages 1 and 2) (corresponding to International Publication WO 97/40648 and U.S. Pat. No. 6,326,091)), or improvement in the negative electrode (for example, referring to Nonpatent Document 1 (Yong Cao, 3 others, "Ultrathin layer alkaline earth metals as stable electron-injecting electrodes for polymer light emitting diodes", JOURNAL OF APPLIED PHYSICS, U.S., Sep. 15, 2000, vol. 88, No. 6, p. 3618)) have been proposed. However, even with these measures, the organic EL display has a lifetime much shorter than that of other FPDs using liquid crystal and the like, and therefore there is room for improvement in order to obtain an organic EL element which can be practically used in various applications.

No knowledge which is a clue to a relationship between a physical property value and the lifetime of the organic EL element has been obtained, and guideline for development in that what characteristics the element needs to have in order to improve the lifetime has not been found yet. In these respects, there is room for improvement.

Further, in a conventional lifetime test of organic EL elements, a method of performing aging test, in which an electric field is actually applied to an element to be tested to cause the element to produce luminescence, and thereby measuring a brightness half-life time of the element, is common. In such a testing method, the element used for the test is deteriorated and therefore can not be used as a commercial product after the test. The aging test needs a long time and therefore the working efficiency is very low. In addition, the organic EL element has a structure in which extremely thin film layers are stacked, and therefore variation in lifetime of the element is easily generated due to unevenness in film thickness of each layer, and it is difficult to determine the lifetime of the element from initial luminescence characteristics, and it is impossible that an element having a defect in lifetime characteristics is selected in the initial lighting test. Naturally, it is also impossible that elements are individually measured for lifetime characteristics. Therefore, in a conventional organic EL element-testing process, suppression of variation in the lifetime characteristics among the elements or selection of the element having a defect in the lifetime characteristics can not be performed sufficiently.

In development and improvement of materials of films constituting the organic EL element or production processes of the element, optimal conditions need to be found. Usually, conditions are optimized by subjecting an element prepared Luminescence lifetime characteristics of the luminescent material used in the organic EL element recently have been widely used as a means for analyzing luminescence characteristics of the organic EL element, as seen in studies on temperature dependency of photoluminescence (hereinafter, also referred to as "PL") intensity (for example, referring to Nonpatent Document 2 (Goushi Kenichi, 3 others, "Unusual luminescence characteristics of Ir(ppy)$_3$ at low temperature", Japan Society of Applied Physics Spring Meeting 2003, p. 1412 and 28p-A-4)) or change of PL characteristics in a stacked film layer (for example, referring to Nonpatent Document 3 (Goushi Kenichi, 3 others, "Exciton migration and energy transfer length of Ir(ppy)$_3$," Japan Society of Applied Physics Autumn Meeting, 2003, p. 1206 and 1a-YL-7)). This shows that the luminescence characteristics of the luminescent material have a great influence on the luminescence characteristics of the element and are used as an indicator for clarifying difference in luminescence characteristics between elements prepared under different conditions. However, there have been few cases of studying the PL characteristics of the organic EL element itself, and particularly, no cases of clarifying the relationship between the PL characteristics and the lifetime characteristics of the element has been reported yet.

SUMMARY OF THE INVENTION

The present invention has been made in view of the above-mentioned state of the art. The present invention has an object to provide an organic electroluminescent element excellent in lifetime characteristics, an organic electroluminescent element-testing device and an organic electroluminescent element-testing method each capable of easily testing lifetime characteristics of an organic electroluminescent element in a short time without deterioration of the element, and an organic electroluminescent display device.

The present inventors thought that, in order to significantly improve lifetime of the organic electroluminescent (EL) element, it is needed to study a root cause of deterioration of the element when research and development are performed for longer lifetime. The inventors noted particularly on photoluminescence (PL) characteristics of the organic EL element, and made various investigations on a relationship between the PL characteristics and the lifetime characteristics. As a result, the inventors found that there is a relationship between the lifetime of the organic EL element (reduction in brightness due to deterioration) and temperature dependency of the PL intensity of the element, that is, in an element excellent in lifetime characteristics, the PL intensity of the element lowers at low temperatures as compared with at ordinary temperatures, and also found that based on degree in the reduction, the lifetime of the element can be estimated. The inventors found, with respect to the temperature dependency of the PL intensity of the organic EL element, that if the organic EL element has a PL intensity at 300 K stronger than a PL intensity at less than 300 K, the organic EL element has a long lifetime, and screening of the defective element can be performed only through measurement of the initial characteristics without deterioration of the element. Thereby, the above-mentioned problems are admirably solved, leading to completion of the present invention.

That is, the present invention is an organic electroluminescent element having a structure in which one or more organic layers including at least a luminescent layer are interposed between electrodes, wherein the organic electroluminescent element has a photoluminescence intensity at 300 K stronger than a photoluminescence intensity at a temperature of less than 300 K.

In the present description, the terms "or more" and "or less" mean that the value described is included. The present invention is described below in more detail.

The organic electroluminescent (EL) element of the present invention has a structure in which one or more organic layers including at least a luminescent layer are interposed between electrodes. The luminescent layer constituting such an organic EL element is a layer including an organic material which produces luminescence by application of an electric field. The organic layer has a structure in which layers including the organic material, such as the luminescent layer, are stacked, and generally includes, in addition to the luminescent layer, a hole injecting layer, a hole transporting layer, an electron transporting layer, and the like. As a preferable embodiment of the organic EL element of the present invention, for example, an embodiment in which a substrate, a positive electrode, a hole transporting layer, a luminescent layer, and a negative electrode are stacked in this order. In this case, it is preferable that at least one of the positive electrode and the negative electrode has transparency.

The organic EL element of the present invention may or may not include other components and is not especially limited as long as it essentially includes such components. Because of the above-mentioned configuration, the element can produce luminescence by application of an electrical field between the electrodes, and usually produces luminescence by function of an alternating electric field.

The above-mentioned organic electroluminescent element has a photoluminescence intensity at 300 K stronger than a photoluminescence intensity at a temperature of less than 300 K. The organic EL element having a photoluminescence intensity (PL intensity) showing such temperature dependency is excellent in lifetime characteristics, and therefore can be preferably used as an electroluminescent element of an organic EL display. More preferable embodiments include an embodiment in which the PL intensity at 300 K is stronger than that at a temperature of less than 200 K. Still more preferable embodiments include an embodiment in which the PL intensity at 300 K is stronger than that at every temperature of less than 300 K.

In the present invention, the photoluminescence means fluorescence phenomenon generated by stimulus of light, such as ultraviolet ray, visible ray, and infrared ray. The PL intensity means energy or the number of photons emitted as fluorescence at a wavelength of 380 to 780 nm (visible region) per unit time. The PL intensity can be measured using a streak scope, a spectroscope, and the like.

The preferable embodiment of the organic EL element of the present invention is mentioned in more detail below.

It is preferable that the organic electroluminescent element has a photoluminescence intensity at 300 K stronger than a photoluminescence intensity at 5 K. The element having such characteristics surely has excellent lifetime characteristics. This is because, the temperature dependency of the PL intensity of the luminescent material largely depends on temperature dependency in a thermal deactivation process of the material, and in some materials, existence of the thermal deactivation process does not become prominent until temperatures near the absolute zero temperature. Therefore, if the temperature dependency of the PL intensity of the organic EL element is measured and the PL intensity measured at 300 K is compared with the PL intensity measured at an ultralow temperature about 5 K, and thereby the lifetime characteristics of the element can be determined with high accuracy.

It is preferable that if the photoluminescence intensity at 5K is defined as a low temperature photoluminescence intensity ratio when the photoluminescence intensity at 300 K is defined as 1, a photoluminescence intensity ratio Y represented by the following formula (1) is 1 or less.

$$Y = \text{(low temperature photoluminescence intensity ratio of organic electroluminescent element)/(low temperature photoluminescence intensity ratio of luminescent layer)} \quad (1)$$

The above-mentioned "PL intensity ratio Y represented by the above formula (1) is 1 or less" means that the low temperature photoluminescence intensity ratio of the organic EL element is smaller than the low temperature photoluminescence intensity ratio of the luminescent layer. Accordingly, the organic EL element having such characteristics has an element configuration preferable for improvement in lifetime characteristics and is particularly excellent in lifetime characteristics. It is more preferable that the PL intensity ratio Y is 0.5 or less.

The low temperature PL intensity ratio of the luminescent layer shown in the above formula (1) can be determined by preparing a luminescent material film having the same composition, thickness, configuration as those in the luminescent layer of the organic EL element, and measuring a low temperature PL intensity ratio of the luminescent material film.

It is preferable that photoluminescence of the organic electroluminescent element has two or more fluorescent components having substantially the same luminescence spectrums and different lifetimes, and each of the two or more fluorescent components has a photoluminescence intensity at 300 K stronger than a photoluminescence intensity at a temperature of less than 300 K. As a result, an organic EL element particularly excellent in lifetime characteristics can be provided. More preferred embodiments include an embodiment in which, in all of the two or more fluorescent components, the PL intensity at 300 K is stronger than the PL intensity at a temperature of less than 200 K. Still more preferred embodiments include an embodiment in which, in all of the two or more fluorescent components, the PL intensity at 300 K is stronger than the PL intensity at every temperature of less than 300 K.

In the present invention, the above-mentioned "photoluminescence of the organic electroluminescent element has two or more fluorescent components" means that two or more luminescence mechanisms, that is, two or more relaxation processes by fluorescence from an excited state exist. The above-mentioned "two or more fluorescent components having substantially the same luminescence spectrums" means that the shapes of the luminescent spectrums, which are derived from luminescence mechanisms respectively, are substantially the same. Further, the "two or more fluorescent components having different lifetimes" means that the fluorescence intensity half-life times of the fluorescent components, which are derived from luminescence mechanisms respectively, are different. Accordingly, if the above-mentioned photoluminescence of the organic EL element having two or more fluorescent components is shown by a graph indicating a fluorescence intensity logarithmically represented in the longitudinal axis and an elapsed time linearly represented in the horizontal axis, decay characteristics of the PL intensity is shown in a curved shape.

It is preferable that each of the two or more fluorescent components has photoluminescence intensity at 300 K stronger than photoluminescence intensity at 5 K. The organic EL element having such characteristics more surely has particularly excellent lifetime characteristics.

Further, the present invention is an organic electroluminescent element-testing device for testing lifetime characteristics of an organic electroluminescent element, wherein the testing device comprises a light source exciting a luminescent material constituting a luminescent layer of the organic electroluminescent element, detection means for detecting a photoluminescence intensity of the organic electroluminescent element, temperature control means for controlling a temperature of the organic electroluminescent element and/or a temperature near the element, data storage means for storing the photoluminescence intensity measured by the detection means, and data processing means for comparing photoluminescence intensities measured at different temperatures.

The above-mentioned light source is not especially limited, and a laser device which emits a laser light having a center wavelength of 325, 337, or 365 nm, or a light source device which picks out only light of an excitation wavelength suitable for the luminescent material from white light by a monochromator and emits the light may be used. The above-mentioned detection means is not especially limited as long as it can detect the PL intensity of the organic EL element photoexcited by the light emitted from the light source. A device which monitors a photocurrent with a photodiode, and a device which monitors a PL intensity using an area of a fluorescent spectrum measured by a spectroscope may be mentioned. The above-mentioned temperature control means is not especially limited, and a device which includes a cooling unit and a heater, and controls temperatures to an optional temperature by controlling output of the cooling unit and the heater, or a control device using a cryostat may be mentioned. The above-mentioned data storage means is not especially limited as long as it can store the data obtained by the detection means. The above-mentioned data processing means is not especially limited as long as it can compare PL intensities of the organic EL element, measured at different temperatures, using the data stored in the data storage means.

The above-mentioned organic EL element-testing device makes it possible to test lifetime characteristics of an organic EL element without performing the aging test, and to select an element insufficient in lifetime characteristics easily in a short time without deterioration of the element. Further, if such a testing device is used for developing organic EL elements optimization of configuration conditions, production process conditions of the elements, and the like can be easily performed in terms of selection of the luminescent material or design of film thickness of the film constituting the element.

Preferred embodiments of the testing device of the organic EL element of the present invention include an embodiment in which the PL intensity of the organic EL element measured at 300 K is compared with the PL intensity of the organic EL element measured at 5 K by the data processing means. In such an embodiment, the lifetime characteristics of the element can be measured with higher accuracy. The organic EL element-testing device of the present invention may have an embodiment in which the light source and each means are combined with each other, and may have an embodiment in which the data storage means and the data processing means are combined and integrated, for example.

Further, the present invention is an organic electroluminescent element-testing method for testing lifetime characteristics of an organic electroluminescent element, wherein the testing method comprises detecting photoluminescence intensities of an organic electroluminescent element at least at two different temperatures, and testing lifetime characteristics of the organic electroluminescent element based on a ratio between the intensities. According to the above-mentioned organic electroluminescent element-testing method, lifetime characteristics of organic EL elements can be tested without performing the aging test, and elements insufficient in lifetime characteristics can be selected easily in a short time without deterioration of the elements. If such a testing device is used for development of organic EL elements, optimization of such as configuration conditions and production process conditions of the elements can be easily performed in terms of selection of the luminescent material or design of film thickness of the film constituting the elements.

The present invention is also an organic electroluminescent element obtained using the organic electroluminescent element-testing device or the organic electroluminescent element-testing method. Such an organic EL element is obtained after high-accurate selection on the lifetime characteristics using the above-mentioned organic EL element-testing device or the above-mentioned organic EL element-testing method. Therefore, such an organic EL element has excellent lifetime characteristics and can be preferably used as an electroluminescent element of an organic EL display.

The present invention is also an organic electroluminescent display device comprising the organic electroluminescent element. Such an organic EL display device (organic EL display) can realize long lifetime.

The organic electroluminescent element of the present invention can provide an element with a long lifetime, because the photoluminescence intensity at 300 K is stronger than the photoluminescence intensity at a temperature of less than 5 K. Such an organic electroluminescent element with a long lifetime can be preferably used as an electroluminescent element of an organic electroluminescent display.

DETAILED DESCRIPTION OF PREFERRED EMBODIMENTS

The present invention is described in more detail below with reference to Examples and drawings, but the present invention is not limited to only the following Examples.

Embodiment 1

Figure 1:
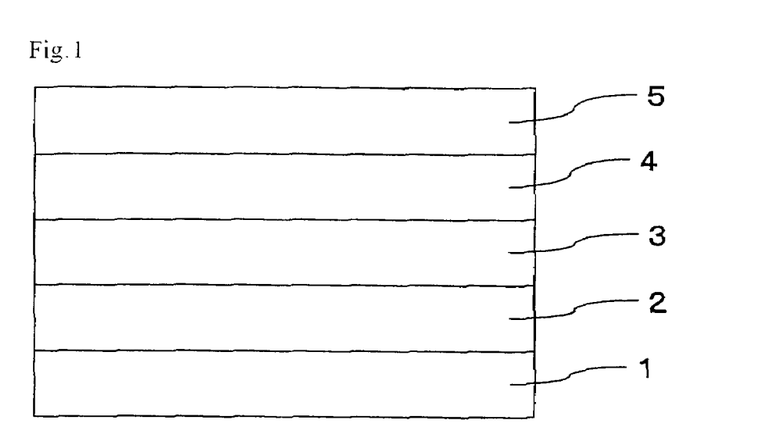
FIG. 1 is a cross-sectional diagram schematically showing a cross sectional configuration of the organic electroluminescent element in Embodiment 1.

FIG. 1 is a cross-sectional diagram schematically showing a cross-sectional configuration of an organic electroluminescent (EL) element in Embodiment 1.

As shown in FIG. 1, the organic EL element of the present Embodiment has a configuration, in which, on the substrate 1, the positive electrode 2 made of ITO and the like, the hole transporting layer 3, and the luminescent layer 4, and the negative electrode 5 are sequentially formed.

The organic EL element shown in FIG. 1 is prepared by the following method, for example.

First, the positive electrode 2 is formed on the substrate 1 having an insulating surface. In the present Embodiment, an electrode-including substrate in which the positive electrode 2 made of ITO (indium oxide-tin oxide) is formed on the surface of the glass substrate 1 in 30 mm×30 mm square is previously prepared and cleaned. As a method of cleaning the electrode-including substrate, a method of performing ultrasonic cleaning for 10 minutes using acetone, isopropyl alcohol (IPA), and the like, and then performing ultraviolet radiation (UV)-ozone cleaning for 30 minutes may be mentioned, for example. As a result, the positive electrode 2 is formed.

Then, the hole transporting layer 3 (thickness: 60 nm, for example) is formed on the positive electrode 2 surface by the following method, for example. First, PEDOT/PSS is dispersed into pure water to prepare a coating liquid for hole transporting layer formation. Then, this coating liquid for hole transporting layer formation is coated on the positive electrode 2 surface using a spin coater. Then, the electrode-including substrate is subjected to thermal drying (200° C., for 5 minutes) in high purity nitrogen atmosphere, and thereby the solvent in the coating liquid for hole transporting layer formation is removed. As a result, the hole transporting layer 3 is formed.

Further, the luminescent layer 4 (thickness: 80 nm, for example) is formed in the following method, for example. First, a polymer luminescent material is dissolved in xylene to prepare a coating liquid for luminescent layer formation. Then, this coating liquid for luminescent layer formation is coated on the hole transporting layer 3 surface using a spin coater. Then, the substrate is subjected to thermal drying in high purity nitrogen atmosphere and thereby the solvent in the coating liquid for luminescent layer formation is removed. As a result, the luminescent layer 4 is formed.

Then, the negative electrode 5 is formed in the following method, for example. First, the substrate 1 in which the luminescent layer 4 is formed is fixed in a chamber for metal evaporation. Then, calcium is deposited (thickness: 30 nm, for example) on the luminescent layer 4 surface by vacuum deposition method, and then silver is deposited (thickness: 300 nm, for example) in the same manner. As a result, the counter electrode 5 is formed.

Finally, glass for sealing (not shown) is attached to the substrate 1 using a UV curable resin, and thereby an organic EL element is completed.

Using the present Embodiment, organic EL elements were prepared by changing the luminescent material and the process conditions, and thereby the functional effects of the present invention were confirmed.

EXAMPLE 1

In an organic EL element in Example 1 (hereinafter, also referred to as element (1)), the luminescent layer 4 was formed by thermally drying a polyfluorene green luminescent material A at a calcination temperature of 150° C. The polyfluorene green luminescent material A is a copolymer compound of a fluorene ring having alkyl chains R and R' with a unit Ar (Ar') of at least one aromatic aryl compounds. The chemical formula is represented by the following formula (A). The polyfluorene green luminescent material A has a molecular weight of hundreds of thousands and the glass transition point varies depending on the unit with which the material A is copolymerized.

[Formula 1]

(A)

In the above formula (A), each of R and R' represents an alkyl chain; each of Ar and Ar' represents an aromatic aryl compound unit; each of l and m is an integer of 1 or more; and n is an integer of 0 or 1 or more. As the aromatic aryl compound, dimethylbenzene, pyridine, benzene, anthracene, spirobifluorene, carbazole unit, benzo amine, bipyridine, and benzothiadiazole may be used.

With respect to the measurement result of the brightness half-life time of the element (1) in the aging test, the luminescent half-life time of the element (1) was 3600 hours at an initial brightness of 1000 cd/m².

EXAMPLE 2

In an organic EL element in Example 2 (hereinafter, also referred to as element (2)), the luminescent layer 4 was formed by thermally drying the polyfluorene green luminescent material A at a calcination temperature of 90° C. With respect to the measurement result of the brightness half-life time of the element (2) in the aging test, the luminescent half-life time of the element (2) was 720 hours at an initial brightness of 1000 cd/m².

Comparative Example 1

In an organic EL element in Comparative Example 1 (hereinafter, also referred to as element (3)), the luminescent layer 4 was formed by thermally drying a polyfluorene green luminescent material B at a calcination temperature of 150° C. With respect to the measurement result of the brightness half-life time of the element (3) in the aging test, the luminescent half-life time of the element (3) was 60 hours at an initial brightness of 1000 cd/m².

The elements (1) to (3) were measured for temperature dependency of PL intensity. For comparison, single layer films each made of the luminescent materials A and B were also measured for temperature dependency of PL intensity. The results are shown below. The calcination temperatures were 150° C. (the luminescent material A) and 150° C. (the luminescent material B) when the single layer films made of the luminescent materials A and B were formed.

Figure 2:
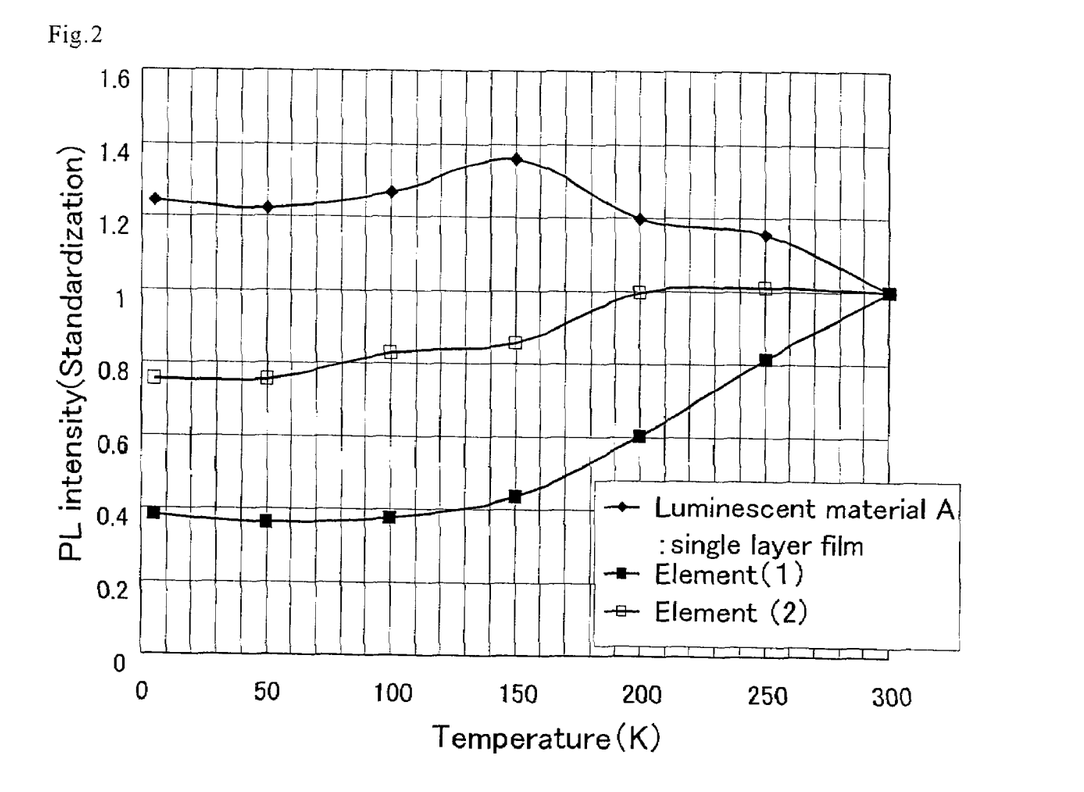
FIG. 2 is a diagram showing temperature dependencies of photoluminescence intensities of the organic electroluminescent elements according to Examples 1 and 2 of the present invention and the luminescent layer (luminescent material single layer film) constituting the elements (1) and (2).

FIG. 2 is a graph showing temperature dependencies of PL intensities of the elements (1) and (2), and the single layer film made of the luminescent material A. It is difficult to compare the PL intensities based on the absolute values, and therefore the PL intensities are shown by standardizing the PL intensity at a normal temperature (300 K) to 1.

FIG. 2 shows that the PL intensity of the single layer film made of the luminescent material A increases with decrease of temperature, and the PL intensity at 5 K becomes 1.24 times the PL intensity at 300 K. In contrast, in the elements (1) and (2), FIG. 2 shows that the PL intensity decreases with decrease of temperature, and the PL intensity at 5 K is weaker than that at 300 K.

These phenomena are mentioned below.

The temperature dependency of the PL intensity of the single layer film made of the luminescent material A has the same tendency as in the temperature dependency of a common fluorescent material. That is, the PL intensity of the fluorescent material is determined by quantum yield $\phi$, and the quantum yield $\phi$ is specified as shown in the following formulae (2) and (3).

[Formula 2]

$$\phi = K_r \times \tau \quad (2)$$

[Formula 3]

$$\tau = 1/(k_r + k_{nr} + k_{isc}) \quad (3)$$

In the above formulae (2) and (3), $k_r$ represents a rate constant of luminescence; $\tau$ represents a fluorescence lifetime; $k_{nr}$ represents a rate constant of non-luminous deactivation; and $k_{isc}$ represents a rate constant of intersystem crossing.

In the above formula (2), the PL intensity, that is, the quantum yield $\phi$ is proportional to the fluorescence lifetime $\tau$. In the constitutional components of the fluorescence lifetime $\tau$ shown in the above formula (3), neither $k_r$ nor $k_{isc}$ has temperature dependency, and $k_{nr}$ is a thermal deactivation component and becomes smaller at low temperatures. Accordingly, the value of the fluorescence lifetime $\tau$ becomes larger with decrease of temperature, and therefore the quantum yield $\phi$ becomes larger, and as a result, the PL intensity is stronger.

However, in the elements (1) and (2) prepared using the luminescent material A, the PL intensity decreased with decrease of temperature. It is believed that this is because, in the elements (1) and (2), as shown in FIG. 1, excitons generated by excitation light are quenched at the interface between the luminescent layer 4 and the hole transporting material 3, and the interface between the luminescent layer 4 and the negative electrode 5, the interfaces being formed because the luminescent layer 4 was interposed between the transporting material 3 and the negative electrode 4. It is considered that the quenching site is simply nonluminescent hole transporting material 3 or negative electrode 5, or a nonluminescent state newly generated by the interface interaction. The excitons are diffused to the quenching site generated at the stacked layer interfaces and quenched, and thereby the quenching of the excitons is generated. The diffusion mode of the excitons in this case is thought to be resonant diffusion (Förster transfer) or exciton diffusion (delocalization of the excitons in the molecular chain or between the molecules). The reduction in the PL intensity, which is thus generated, has temperature dependency, and the reason why the PL intensity of the organic EL element decreased with decrease of temperature is thought to be extension of the diffusion length of the excitons or increase of the quenching site with decrease of temperature. That is, the difference in reduction in the PL intensity of the organic EL element is thought to be derived from difference in interaction at the interface between the luminescent layer 4 and the hole transporting material 3 and the interface between the luminescent layer 4 and the negative electrode 5, the interfaces being formed because they are stacked, or derived from difference in diffusion characteristics of the excitons in bulk itself.

Comparison of the element (1) with the element (2) shows that reduction in the PL intensity from 300 K to 5K in the element (1) having a long brightness half-life time is larger than that in the element (2). This shows that the element (1) has large interface interactions or large diffusion characteristics of the excitons.

Figure 3:
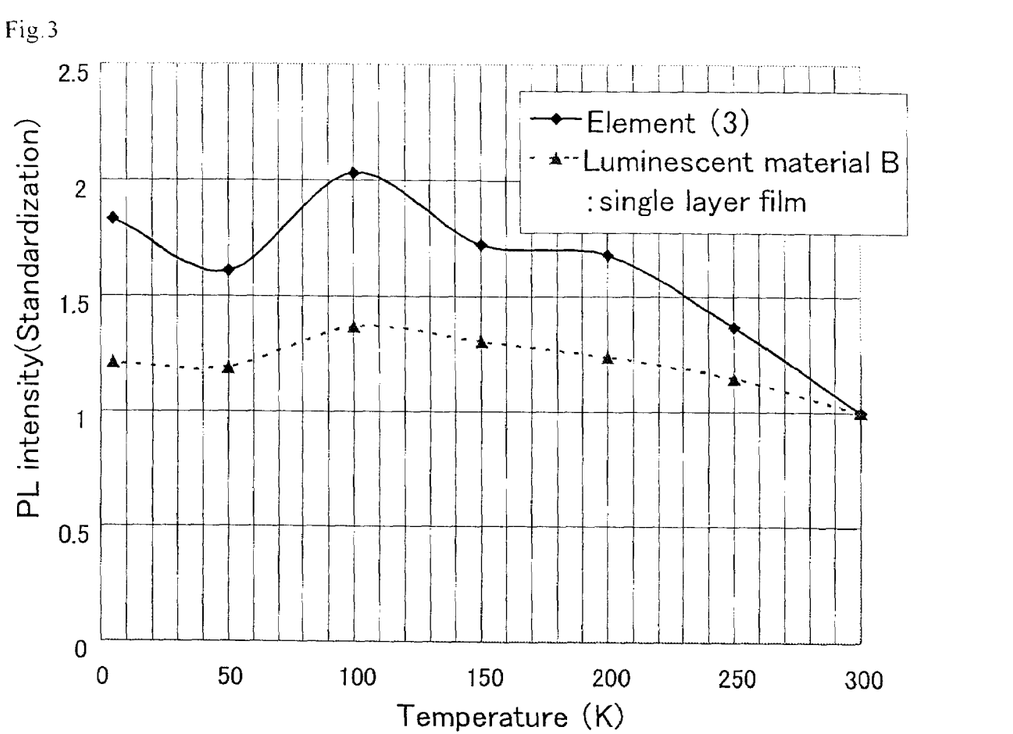
FIG. 3 is a diagram showing temperature dependencies of photoluminescence intensities of the organic electroluminescent element according to Comparative Example 1 and the luminescent layer (luminescent material single layer film) constituting the element.

With respect to the element (3), as in the elements (1) and (2), the temperature dependencies of the PL intensities of the element (3) and the single layer film made of the luminescent material B are shown in FIG. 3.

FIG. 3 shows that in the single layer film made of the luminescent material B, as in the single layer film made of the luminescent material A, the PL intensity at 5 K was stronger than that at 300 K. In contrast, in the element (3), the PL intensity at 5 K was stronger than that at 300 K, which is different from in the elements (1) and (2). This shows that the element (3) is a system which has weaker interaction at the interface between the luminescent material 4 and the hole transporting material 3, and the interface between the luminescent layer 4 and the negative electrode 5, or the element (3) is a system in which diffusion of the excitons is hardly generated. Such an element (3) has an extremely shorter luminescent half-life time than that in the elements (1) and (2).

These results show that there is a clear relationship between the brightness half-life time and the temperature dependency of the PL intensity in the organic EL element.

Figure 4:
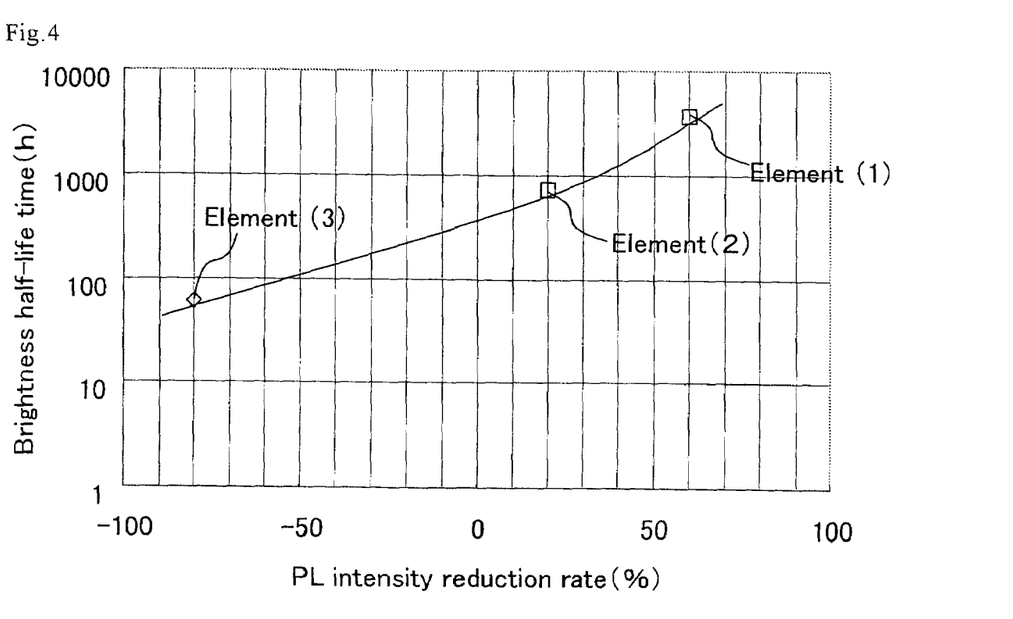
FIG. 4 is a diagram showing relationships between the reduction rate of the photoluminescence intensities and the brightness half-life time in the organic electroluminescent elements.

FIG. 4 shows relationships between the PL intensity reduction rates with decrease of temperature from 300 K to 5 K, and the brightness half-life times. The PL intensity reduction rate in FIG. 4 is represented by the following formula (4). The PL intensity reduction rate larger than 0 means that the PL intensity of the organic EL element decreases with decrease of temperature. The PL intensity reduction rate smaller than 0 means that the PL intensity of the organic EL element increases with decrease of temperature. FIG. 4 shows that the larger the PL intensity reduction rate of the organic EL element with decrease of temperature from 300 K to 5 K is, the longer the element lifetime is.

[Formula 4]

$$PL \text{ intensity reduction rate } (\%) = \{(PL \text{ intensity at } 300K) - (PL \text{ intensity at } 5K)\}/(PL \text{ intensity at } 300 K) \times 100 \quad (4)$$

Figure 5:
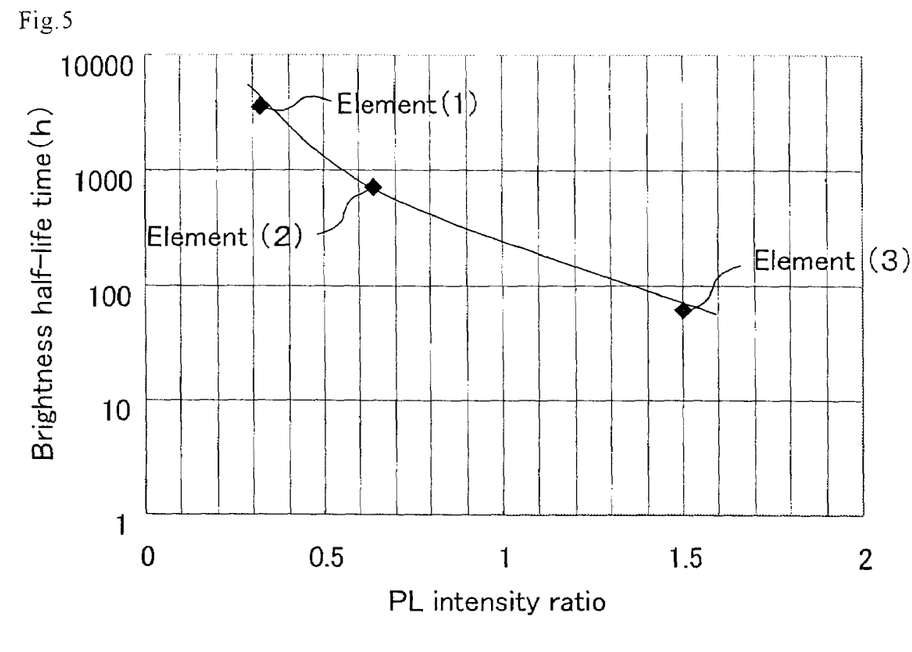
FIG. 5 is a diagram showing relationships between the photoluminescence intensity ratios Y and the brightness half-life times in the organic electroluminescent elements.

FIG. 5 shows relationships between the PL intensity ratios Y and the brightness half-life times of the organic EL elements. The PL intensity ratio smaller than 1 means that the reduction in the PL intensity of the organic EL element with decrease of temperature is smaller than that in the luminescent material single layer film. The PL intensity ratio Y larger than 1 means that reduction in the PL intensity of the organic EL element with decrease of temperature is larger than that in the luminescent material single layer film. FIG. 5 shows that the smaller the PL intensity ratio Y is, the longer the element lifetime is. In some luminescent materials, thermal deactivation in light excitation state is large. In organic EL elements using such a luminescent material, there is a possibility that the PL intensity increases with decrease of temperature from 300 K to 5 K. In such a case, degree of the reduction in the PL intensity caused by element formation can not be estimated, but degree of the reduction in the PL intensity caused by the element formation can be estimated by comparison with the luminescent material singly layer film. As a result, the element lifetime can be estimated.

In the present Embodiment, in elements prepared by changing the material of the luminescent layer or the process conditions, in addition to the elements (1) to (3), the characteristics were reproduced in an almost curved shape, as shown in FIGS. 4 and 5. Accordingly, FIGS. 4 and 5 clearly show the relationship between the temperature dependency of the PL intensity and the element lifetime, in various elements. These results show that in the element configuration in which the temperature dependency of the PL intensity is large, elements excellent in lifetime characteristics can be obtained.

Figure 6:
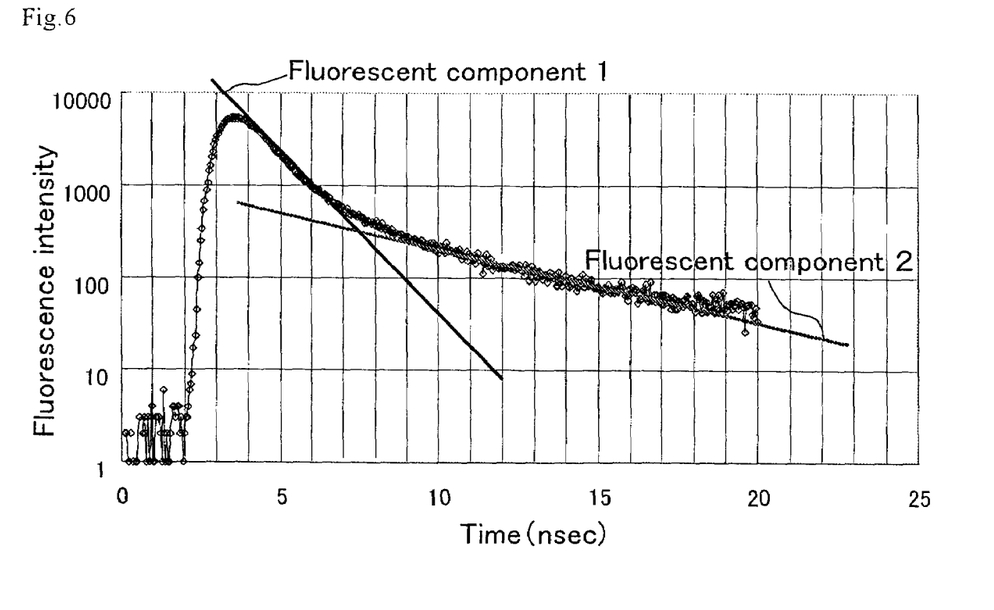
FIG. 6 is a diagram showing the fluorescence decay characteristics of the element (1) according to Example 1 of the present invention.
Figure 7:
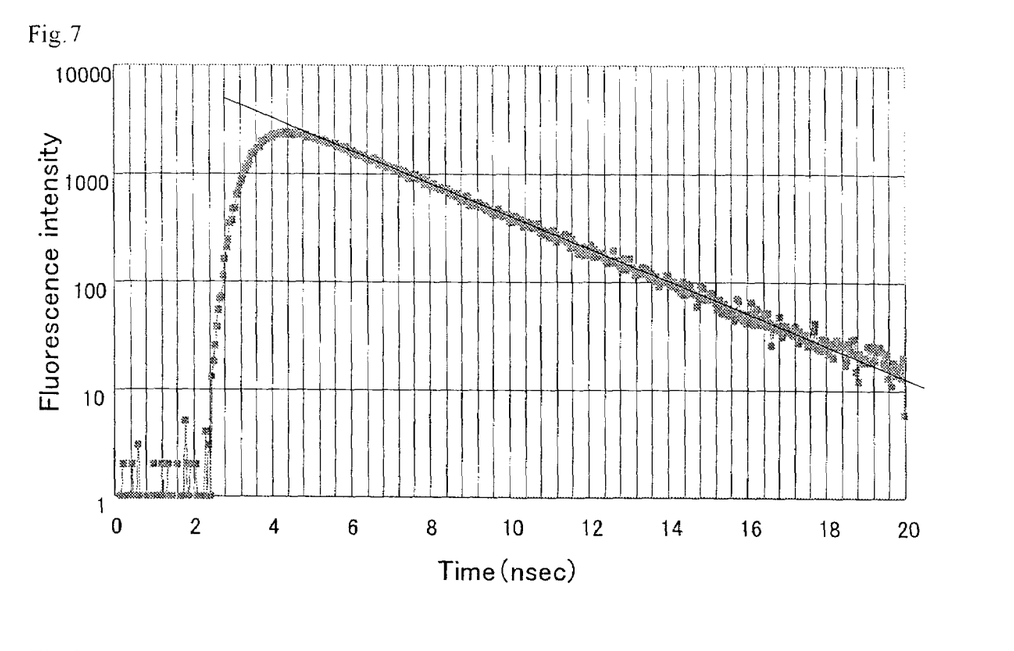
FIG. 7 is a diagram showing the fluorescence decay characteristics of the luminescent material A in a solution state according to Examples 1 and 2 of the present invention.

Further, the element (1) was measured for time-resolved characteristics of the PL intensity with a streak camera (product of Hamamatsu Photonics K.K.) to obtain a fluorescence intensity decay curve as shown in FIG. 6. This decay curve shows that there are two components forming the PL intensity of the element (1). Usually, a fluorescence decay curve of a fluorescent compound used in an organic EL element and the like often shows exponential decay characteristics and has a single fluorescent component, as shown in FIG. 7. FIG. 7 shows fluorescence decay characteristics of the luminescent material A in a solution state used in this embodiment. The decay characteristics of the single fluorescent component are represented by the following formula (5).

[Formula 5]

$$I = A \exp \tau \quad (5)$$

In the above formula (5), "I" represents a PL intensity, A represents an initial PL intensity of a fluorescent component (constant number), τ represents a fluorescence lifetime. As shown in FIG. 7, the decay characteristics of the fluorescent component is usually shown in a straight shape, in a semilogarithmic graph indicating a decay time linearly represented in the horizontal axis and a PL intensity logarithmically represented in the longitudinal axis. However, the decay characteristics in a curved shape shown in FIG. 6 can not be explained based on the single fluorescent component, which suggests that the decay characteristics are constituted by plural fluorescent components having different fluorescent lifetimes. In this case, if plural fluorescent components A, B, . . . exist, the fluorescence decay characteristics are simply represented by the following formula (6), and the PL intensity I is considered to be a sum of the PL intensities of the plural fluorescent components.

[Formula 6]

$$I = A \exp \tau_A + B \exp \tau_B + \ldots \quad 6)$$

In the above formula (6), A, B, and the like each represent an initial PL intensity (constant number) of each fluorescent component, and $\tau_A$, $\tau_B$, and the like each represent a fluorescence lifetime of each fluorescent component. Such existence of the plural fluorescent components shows that there are plural luminescence mechanisms having substantially the same luminescent spectrums.

The luminescent material A used in Examples 1 and 2 had only one fluorescent component shown in FIG. 7, in a solution state. However, the material A had two fluorescent components shown in FIG. 6 in a thin film state, that is, in an element. This shows that, in the solution state, the luminescent material spread in the solution and produced fluorescence in a single luminescence mechanism, but in the thin film state, the luminescence material aggregated inside the film, and thereby interaction inside the constitutional molecule or between the molecules became larger, and then the material A had two luminescence mechanisms. The luminescent material B used in Comparative Example 1 had a single fluorescent component not only in a solution state but also in a thin film state (element (3)), and had a very short element lifetime. Accordingly, it is found that the element having plural fluorescent components in an element state can provide an element excellent in element lifetime.

Two fluorescent components exist also in the element (2). The two fluorescent components in the element (1) and (2) were components having a fluorescence lifetime of about 2 nsec and having a fluorescent lifetime of about 7 nsec. Hereinafter, the component having a fluorescent lifetime of 2 nsec is defined as fluorescent component 1, and the component having a fluorescent lifetime of 7 nsec is defined as fluorescent component 2.

Figure 8:
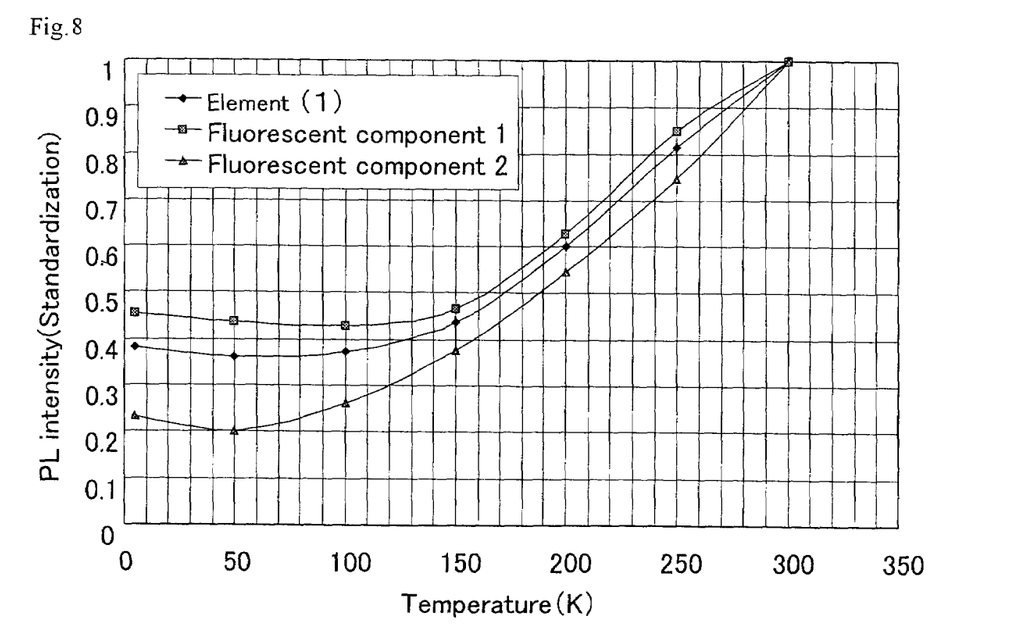
FIG. 8 is a diagram showing the temperature dependencies of the photoluminescence intensities of the element (1) according to Example 1 of the present invention and the fluorescent components 1 and 2.
Figure 9:
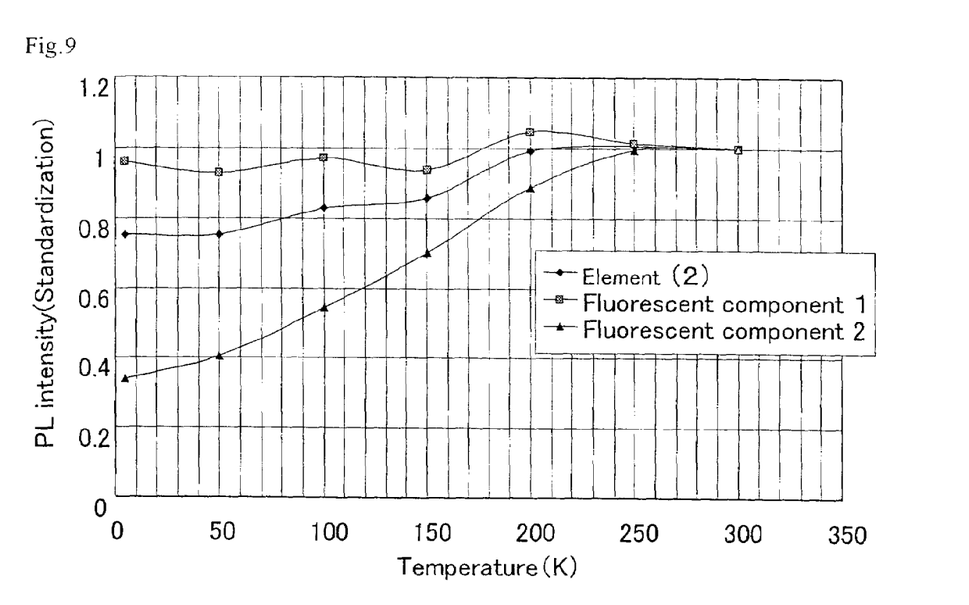
FIG. 9 is a diagram showing the temperature dependencies of the photoluminescence intensities of the element (2) according to Example 2 of the present invention and the fluorescent components 1 and 2.

The fluorescence decay curve of the element (1) obtained in FIG. 6 is divided into the fluorescent component 1 and the fluorescent component 2. The temperature dependencies of the PL intensities of the fluorescent components 1 and 2 are each shown in FIG. 8. Also in the element (2), the fluorescent decay curve is divided into the fluorescent component 1 and the fluorescent component 2 and the temperature dependencies of the PL intensities of the fluorescent components 1 and 2 are each shown in FIG. 9. With respect to the element (1), FIG. 8 shows that, in the PL intensity at 5 K, the fluorescent component 1 was relatively reduced to about 0.46, and the fluorescent component 2 was relatively reduced to about 0.25. In contrast, with respect to the element (2), FIG. 9 shows that change in the PL intensity with decrease of temperature was hardly observed in the fluorescent component 1, and in the fluorescent component 2, the PL intensity was relatively reduced to about 0.35, but the degree of the reduction was smaller than that in the element (1).

Accordingly, it is found that if the organic EL element has plural fluorescent components and the PL intensity at an ultralow temperature (5K) is lower than the PL intensity at a normal temperature (300 K) in each of the plural fluorescent components, such an element has long element lifetime. It is also found that as the degree of the reduction in the PL intensity of each fluorescent component with decrease of temperature from the normal temperature to the ultralow temperature becomes large, an element having a longer lifetime can be provided.

The constitutional materials of the organic EL element are mentioned below.

The substrate 1 in the present Embodiment preferably has an insulating surface. Various substrates, for example, substrates made of inorganic materials such as glass and quartz, substrates made of plastic such as polyethylene terephthalate, substrates made of ceramics such as alumina, substrates prepared by coating an insulating substance such as $SiO_2$ and an organic insulating material on a metal substrate made of aluminum, iron, and the like, and substrates having a metal surface subjected to insulating treatment by anodic oxidation method and the like may be used.

On the substrate 1, a switching element such as thin film transistor (TFT) may be formed. If a polysilicon TFT is formed by a low-temperature process, it is preferable that a substrate which is neither fused nor distorted at temperatures of 500° C. or less is used. If the polysilicon TFT is formed by a high-temperature process, it is preferable that a substrate which is neither fused nor distorted at temperature of 1000° C. or less is used.

The positive electrode 2 and the negative electrode 5 are formed using publicly known electrode materials.

Examples of materials of the positive electrode 2 injecting holes into the organic layer 4 include metals with high work function, such as Au, Pt, and Ni, and transparent electrical conducting materials such as ITO, IDIXO (indium oxide-indium zinc oxide; $In_2O_3(ZnO)_n$), and $SnO_2$.

Examples of the negative electrode 5 injecting electrons into the organic layer 4 include metal electrodes prepared by stacking a metal with low work function and a stable metal such as Ca/Al, Ce/Al, Cs/Al, and Ba/Al, metal electrodes containing a metal with low work function such as Ca:Al alloy, Mg:Ag alloy, and Li:Al alloy, electrodes prepared by combination of an insulating layer (thin film) with a metal electrode such as LiF/Al, LiF/Ca/Al, and $BaF_2$/Ba/Al. As a method of forming the positive electrode 2 and the negative electrode 5, dry process such as evaporation method, electron beam (EB) method, molecular beam epitaxy (MBE) method, and sputtering method, or wet process such as spin coating method, printing method, and ink jet method may be used.

The luminescent layer 4 may have a signal layer structure or a multi-layer structure.

The luminescent layer 4 can be formed using a publicly known organic luminescent material. The luminescent layer 4 can be formed by dissolving a luminescent material in a solvent and thereby preparing a coating liquid for organic luminescent layer formation, and performing wet process using the coating liquid, as in the present Embodiment. The coating liquid for organic luminescent layer formation is a solution containing at least one luminescent material and may contain two or more luminescent materials. The solvent used in the coating liquid for organic luminescent layer formation is not especially limited as long as the luminescent material can be dissolved or dispersed into the solvent. For example, pure water, methanol, ethanol, tetrahydrofuran (THF), chloroform, toluene, xylene, trimethyl benzene and the like may be used. The coating liquid for organic luminescent layer formation may contain a resin for bonding, in addition to the luminescent material, and may contain a leveling agent, a luminescence assistant agent, a charge injecting and transporting material, additives (a donor, an acceptor, and the like), and a luminescent dopant. Examples of the resin for bonding include polycarbonate and polyester. The luminescent layer 4 may be formed by dry process. The luminescent layer 4 formed by dry process also may contain a luminescence assistant agent, a charge transporting material, additives (a donor, an acceptor, and the like), and a luminescent dopant.

Publicly known luminescent materials for organic EL elements may be used as the luminescent material of the luminescent layer 4, but the material is not limited thereto. Specifically, low molecular luminescent materials, polymer luminescent materials, and precursors of polymer luminescent materials may be used.

Examples of the low molecular luminescent materials include fluorescent organic materials, for example, aromatic dimethylidyne compounds such as 4,4'-bis(2,2'-diphenyl vinyl)-biphenyl (DPVBi), oxadiazole compounds such as 5-methyl-2-[2-[4-(5-methyl-2-benzoxazolyl)phenyl]vinyl] benzoxazole, triazole derivatives such as 3-(4-biphenylyl)-4-phenyl-5-t-butylphenyl-1,2,4-triazole (TAZ), styryl benzene compounds such as 1,4-bis(2-methyl styryl)benzene, thiopyrazine dioxide derivatives, benzoquinone derivatives, naphthoquinone derivatives, anthraquinone derivatives, diphenoquinone derivatives, and fluorenone derivatives, and fluorescent organic metal compounds such as azomethine zinc complex, and (8-hydroxy quinolynate) aluminum complex (Alq3). Examples of the polymer luminescent materials include fluorescent organic metal compounds such as poly(2-decyloxy-1,4-phenylene) (DO-PPP), poly[2,5-bis-[2-(N,N,N-triethylammonium)ethoxy]-1,4-phenyl-ortho-1,4-phenylene]dibromide (PPP-NEt$^{3+}$), poly[2-(2'-ethylhexyloxy)-5-methoxy-1,4-phenylenevinylene] (MEH-PPV), poly[5-methoxy-(2-propanoxysulfonide)-1,4-phenylenevinylene] (MPS-PPV), poly[2,5-bis-(hexyloxy)-1,4-phenylene-(1-cyanovinylene)] (CN-PPV), and poly(9,9-dioctylfluorene) (PDAF). Examples of the precursors of polymer luminescent materials include PPV precursors, PNV precursors, and PPP precursors.

The hole transporting layer 3 can be formed by wet process using a coating liquid for hole transporting layer formation prepared by dissolving at least one hole transporting material in a solvent, as in the present Embodiment. The coating liquid for hole transporting layer formation may contain two or more charge injecting and transporting materials. The coating liquid for hole transporting layer formation may contain a resin for bonding, and in addition, may contain a leveling agent, additives (a donor, an acceptor, and the like), and the like. Polycarbonate, polyester, and the like may be used as the resin for bonding, for example. The solvent used in the coating liquid for hole transporting layer formation is not especially limited as long as a hole transporting material can be dissolved or dispersed into the solvent. For example, pure water, methanol, ethanol, THF, chloroform, xylene, trimethyl benzene may be used, for example. The hole transporting layer 3 may be formed by dry process. The hole transporting layer 3 formed by dry process also may contain additives (a donar, an acceptor, and the like).

Publicly known hole transporting materials for organic EL elements or for organic photoconductors may be used as the hole transporting material. Examples thereof include inorganic p type semiconductor materials; low molecular materials, for example, porphyrin compounds, aromatic tertiary amine compounds such as N,N'-bis-(3-methylphenyl)-N,N'-bis(phenyl)-benzidine (TPD) and N,N'-di(naphthalene-1-yl)-N,N'-diphenyl-benzidine (NPD), hydrazone compounds, quinacridone compounds, and styryl amine compounds; polymer materials such as polyaniline (PANI), 3,4-polyethylene-dioxythiophene/polystyrene sulfonate (PEDOT/PSS), poly[triphenylamine derivative] (Poly-TPD), and polyvinyl carbazole (PVCz); and precursors of polymer materials such as poly(p-phenylenevinylene) precursor (Pre-PPV) and poly (p-nephthalenevinylene) precursor (Pre-PNV).

Embodiment 2

Figure 10:
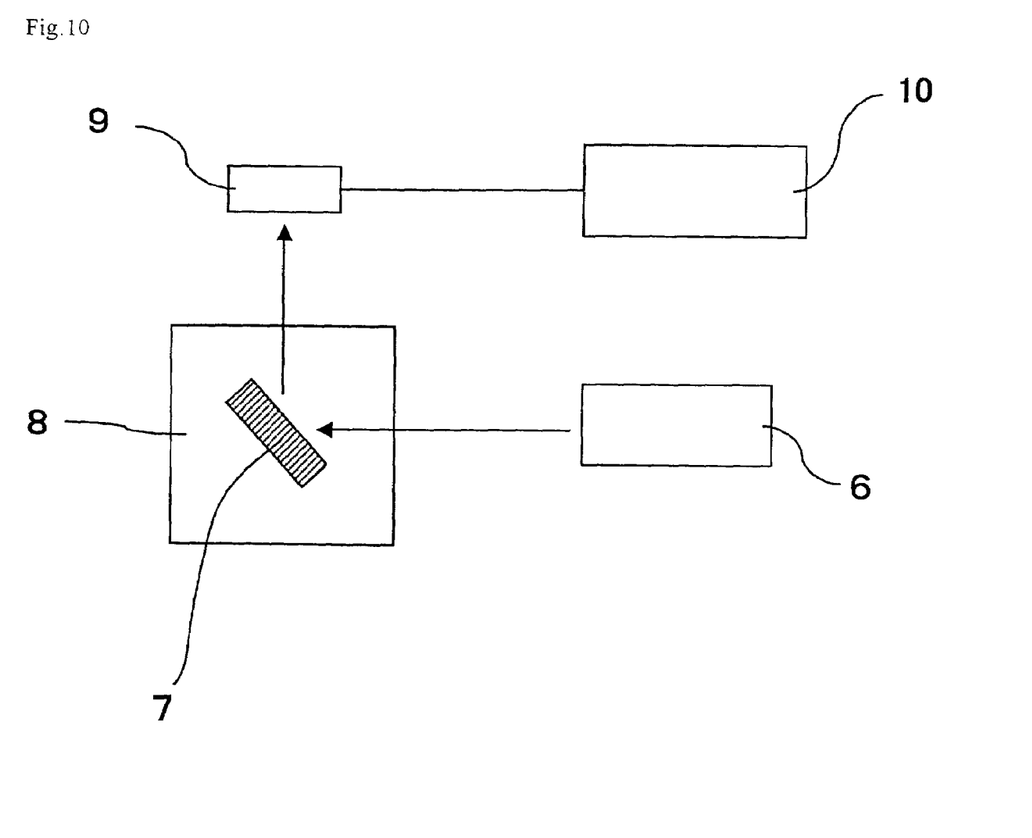
FIG. 10 is a diagram schematically showing the configuration of the organic electroluminescent element-testing device according to Embodiment 2 of the present invention.

The Embodiment 2 of the present invention is mentioned with reference to FIG. 10. The testing device of the organic EL element of the present Embodiment can estimate element lifetime without performing the aging test and thereby determine good-quality products. Further, the testing device can be used for determining optimal conditions of the process conditions, the materials, and the like.

The testing device according to the present Embodiment includes the excitation light source 6 irradiating the test element 7 with excitation light, the detector 9 detecting fluorescence emitted from the test element 7, the temperature control device 8 capable of controlling a temperature of the test element 7 or a temperature around the test element 7, and the data storage processing device 10 capable of recording the detected PL intensity and comparing the PL intensities, as shown in FIG. 10. The arrow in FIG. 10 schematically shows optical paths of the excitation light and the fluorescence.

The excitation light source 6 is not especially limited as long as it is a light source capable of exciting the luminescent material used in the element. For example, a light source which emits a laser light having a center wavelength of 325, 337, or 365 nm, or a light source device which picks out only light of an excitation wavelength suitable for the luminescent material from white light by a monochromator and emitting the light may be used. In the present Embodiment, a nitrogen laser pumped dye laser (center wavelength: 337 nm) was used. The detector 9 is not especially limited as long as it is a device capable of monitoring the PL intensity of the test element 7. A device which monitors a photocurrent with a photodiode, and a device which monitors a PL intensity using an area of a fluorescent spectrum measured by a spectroscope may be mentioned. In the present Embodiment, a system which includes a streak scope and a spectroscope, and measures fluorescent energy for a specified time is used.

As the temperature control device 8, a cooling device, a heater, and a control device which controls temperatures to an optional temperature by controlling output of the cooling device and the heater are preferably used. In the present invention, it is preferable that the PL intensities at a normal temperature (300 K) and an ultralow temperature (5K) are measured, and therefore a control device using a cryostat is preferably used. In the present Embodiment, the PL intensities at the normal temperature and the ultralow temperature were measured using a cryostate. However, if change in the PL intensity clearly appears at the region more close to the normal temperature, the PL intensity at the normal temperature can be compared with that at a liquid nitrogen temperature (about 70 K) with a cooling unit using liquid nitrogen.

EXAMPLE 3

In the present Example, using the organic EL element-testing device having the above-mentioned configuration, test of lifetime characteristics of an organic EL element was performed as follows.

First, the characteristics shown in FIG. 4 were previously stored in the testing device in order to select good-quality products based on intensity ratio of the PL intensity of the element at the normal temperature to that at the ultralow temperature. Then, the test sample 7 was placed in the testing device, and measured for PL intensities at a normal temperature (300 K) and at 5 K. The intensity ratio was calculated by the date storage processing device 10. The thus-obtained value of the intensity ratio was compared with the characteristics in FIG. 4, and thereby the test sample 7 was estimated for element lifetime. For checking the result, this test sample 7 was actually subjected to the aging test, and thereby almost the same result as in the estimation of the lifetime calculated by the present testing device could be obtained.

In the testing device of the organic EL element of the present Embodiment, there is no need to perform the aging test. Therefore, the element lifetime can be estimated easily in a short time without deterioration of the element. The organic EL element after tested can be used as a commercial product as it is because the element characteristics are not deteriorated by the test.

EXAMPLE 4

In the present Example, the following test was performed using the organic EL element testing device having the above-mentioned configuration, in order to find optimal conditions of the element configuration of the organic EL element.

In order to find optimal conditions of an organic El element using a novel luminescent material C, an element having a structure in which ITO, PEDOT, the luminescent material C, and the negative electrode are sequentially stacked was prepared by varying conditions of film thickness of the PEDOT, film thickness of the luminescent material C and the negative electrode material. In order to find the best element lifetime conditions, each element prepared under each condition was estimated for lifetime using the testing device. As a result, the ratio of the PL intensity obtained by the measurement was compared with the characteristic data in FIG. 4 previously stored, and thereby the best conditions can be found. Also in the present Example, the lifetime characteristics of the element can be estimated without actually aging the organic EL element. Therefore, optimal conditions for element preparation can be found easily in a short time.

The present application claims priority under 35 U.S.C. § 119 on Patent Application No. 2004-178600 filed in Japan on Jun. 16, 2004, the entire contents of which are hereby incorporated by reference.

The invention claimed is:

1. An organic electroluminescent element having a structure in which one or more organic layers including at least a luminescent layer are interposed between electrodes, wherein
the organic electroluminescent element has a photoluminescence intensity at 300 K stronger than a photoluminescence intensity at a temperature of less than 300 K; and
photoluminescence of the organic electroluminescent element has two or more fluorescent components having substantially the same luminescence spectrums and different lifetimes.

2. An organic electroluminescent element having a structure in which one or more organic layers including at least a luminescent layer are interposed between electrodes, wherein
the organic electroluminescent element has a photoluminescence intensity at 300 K stronger than a photoluminescence intensity at a temperature of less than 300 K; and
a ratio of the photoluminescence intensity at 5K to the photoluminescence intensity at 300 K of the luminescent layer is higher than a ratio of the photoluminescence intensity at 5K to the photoluminescence intensity at 300 K of the organic electroluminescent element.

3. The organic electroluminescent element according to claim 1, wherein each of the two or more fluorescent components has a photoluminescence intensity at 300 K stronger than a photoluminescence intensity at a temperature of less than 300 K.

4. The organic electroluminescent element according to claim 3, wherein each of the two or more fluorescent components has a photoluminescence intensity at 300 K stronger than a photoluminescence intensity at 5 K.

5. An organic electroluminescent display device comprising the organic electroluminescent element of claim 1.

6. The organic electroluminescent element according to claim 1, wherein the organic electroluminescent element has a photoluminescence intensity at 300 K stronger than a photoluminescence intensity at 5 K.

* * * * *